United States Patent
Wang

(10) Patent No.: US 9,831,766 B2
(45) Date of Patent: Nov. 28, 2017

(54) CHARGE PUMP AND ASSOCIATED PHASE-LOCKED LOOP AND CLOCK AND DATA RECOVERY

(71) Applicant: MEDIATEK INC., Hsin-Chu (TW)

(72) Inventor: Teng-Yi Wang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/275,483

(22) Filed: Sep. 26, 2016

(65) Prior Publication Data
US 2017/0149329 A1    May 25, 2017

Related U.S. Application Data

(60) Provisional application No. 62/257,237, filed on Nov. 19, 2015.

(51) Int. Cl.
*H02M 3/07* (2006.01)
*H03L 7/08* (2006.01)
*H03L 7/089* (2006.01)
*H03L 7/099* (2006.01)

(52) U.S. Cl.
CPC ............ *H02M 3/07* (2013.01); *H03L 7/0807* (2013.01); *H03L 7/0895* (2013.01); *H03L 7/099* (2013.01)

(58) Field of Classification Search
CPC ........ H02M 3/07; H03L 7/087; H03L 7/0895; H03L 7/099
USPC ................. 327/147, 148, 157, 161
See application file for complete search history.

(56) References Cited

U.S. PATENT DOCUMENTS

| | | |
|---|---|---|
| 5,699,387 A | 12/1997 | Seto |
| 6,304,115 B1 | 10/2001 | Beaulieu |
| 2005/0077955 A1 | 4/2005 | Dosho |
| 2006/0145770 A1 | 7/2006 | Manetakis |
| 2011/0133800 A1* | 6/2011 | Yamazaki ............ H03L 7/0895 327/157 |
| 2011/0199136 A1* | 8/2011 | Tsai ........................ H02M 3/07 327/157 |

OTHER PUBLICATIONS

Craninckx, "A Fully Integrated CMOS DCS-1800 Frequency Synthesizer", IEEE Journal of Solid-State Circuits, vol. 33, No. 12, Dec. 1998.
Chris Diorio et al., A Low-Noise, GaAs/AlGaAs, Microwave Frequency-Synthesizer IC, IEEE Journal of Solid-State Circuits, vol. 33, No. 9, Sep. 1998, pp. 1306-1312, XP000854358.

* cited by examiner

*Primary Examiner* — John Poos
(74) *Attorney, Agent, or Firm* — Winston Hsu

(57) ABSTRACT

A charge pump includes a current source circuit, a current sink circuit and a switch circuit. The switch circuit is coupled between the current source circuit and the current sink circuit, and is arranged for generating a first current at a first output terminal and generating a second current at a second output terminal according to a first control signal and a second control signal, wherein each of the first current and the second current is generated from the current source circuit.

20 Claims, 9 Drawing Sheets

CHARGE PUMP AND ASSOCIATED PHASE-LOCKED LOOP AND CLOCK AND DATA RECOVERY

CROSS REFERENCE TO RELATED APPLICATIONS

This application claims the priority of U.S. Provisional Application No. 62/257,237, filed on Nov. 19, 2015, which is included herein by reference in its entirety.

BACKGROUND

Some phase-locked loops (PLLs) may be designed to have an active filter to have a capacitance multiplier effect. However, such designs need two charge pumps to provide two different currents to the active filter. The two charge pumps may increase the chip area and the manufacturing costs.

SUMMARY

It is therefore an objective of the present invention to provide a charge pump sharing technique to solve the above-mentioned problem.

According to one embodiment of the present invention, a charge pump comprises a current source circuit, a current sink circuit and a switch circuit. The switch circuit is coupled between the current source circuit and the current sink circuit, and is arranged for generating a first current at a first output terminal and generating a second current at a second output terminal according to a first control signal and a second control signal, wherein each of the first current and the second current is generated from the current source circuit.

According to another embodiment of the present invention, a phase-locked loop comprises a phase frequency detector, a charge pump, an active filter, a voltage-controlled oscillator and a frequency divider. The phase frequency detector is arranged for comparing a reference clock with a feedback clock to generate a first control signal and a second control signal. The charge pump comprises a current source circuit, a current sink circuit and a switch circuit, wherein the switch circuit is arranged for generating a first current at a first output terminal and generating a second current at a second output terminal according to at least one of the first control signal and the second control signal, and each of the first current and the second current is generated from the current source circuit. The active filter is arranged for generating a control signal according to the first current and the second current. The voltage-controlled oscillator is coupled to the active filter, and is arranged for generating an oscillation signal according to the control signal. The frequency divider is coupled to the voltage-controlled oscillator, and is arranged for frequency dividing the oscillation signal to generate the feedback signal.

According to another embodiment of the present invention, a clock and data recovery comprises a phase detector, a charge pump, an active filter and a voltage-controlled oscillator. The phase detector is arranged for comparing a reference clock with a feedback clock to generate a first control signal and a second control signal. The charge pump comprises a current source circuit, a current sink circuit and a switch circuit, wherein the switch circuit is arranged for generating a first current at a first output terminal and generating a second current at a second output terminal according to the first control signal and the second control signal, and each of the first current and the second current is generated from the current source circuit. The active filter is arranged for generating a control signal according to the first current and the second current. The voltage-controlled oscillator is coupled to the active filter, and is arranged for generating the feedback clock according to the control signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
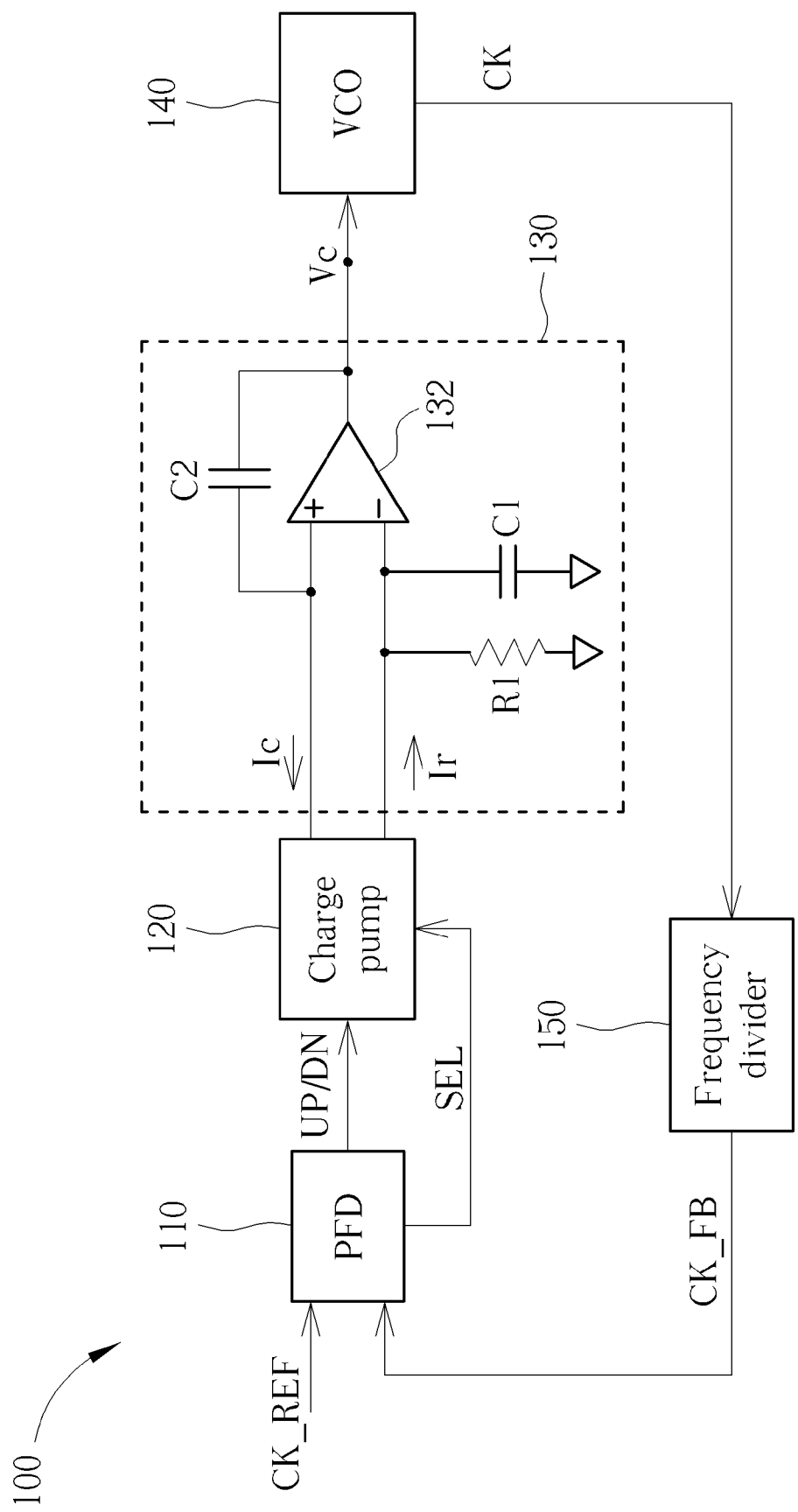
FIG. 1 is a diagram illustrating a PLL according to one embodiment of the present invention.

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections Please refer to FIG. 1, which is a diagram illustrating a PLL 100 according to one embodiment of the present invention. As shown in FIG. 1, the PLL 100 comprises a phase frequency detector 110, a charge pump 120, an active filter 120, a voltage-controlled oscillator 140 and a frequency divider 150, where the active filter 120 comprises an operational amplifier 132, a resistor R1 and two capacitors C1 and C2. In this embodiment, only one charge pump 120 is positioned in the PLL 100 to provide two currents Ic and Ir to the active filter 130. In the operations of the PLL 100, the phase frequency detector 110 compares a reference clock CK_REF and a feedback clock CK_FB to generate a first control signal and a second control signal (hereinafter, an up signal UP and a down signal DN), and in an optional design, the phase frequency detector 110 further generates a selection signal SEL to the charge pump 120. The charge pump 120 receives the up signal UP, the down signal DN and the selection signal, if any, to generate two currents Ic and Ir. The active filter 130 generates a control signal Vc according to the currents Ic and Ir. The voltage-controlled oscillator 140 generates an oscillation signal CK according to the control signal Vc. The frequency divider 150 frequency divides the oscillation signal CK to generate the feedback signal CK_FB.

Figure 2:
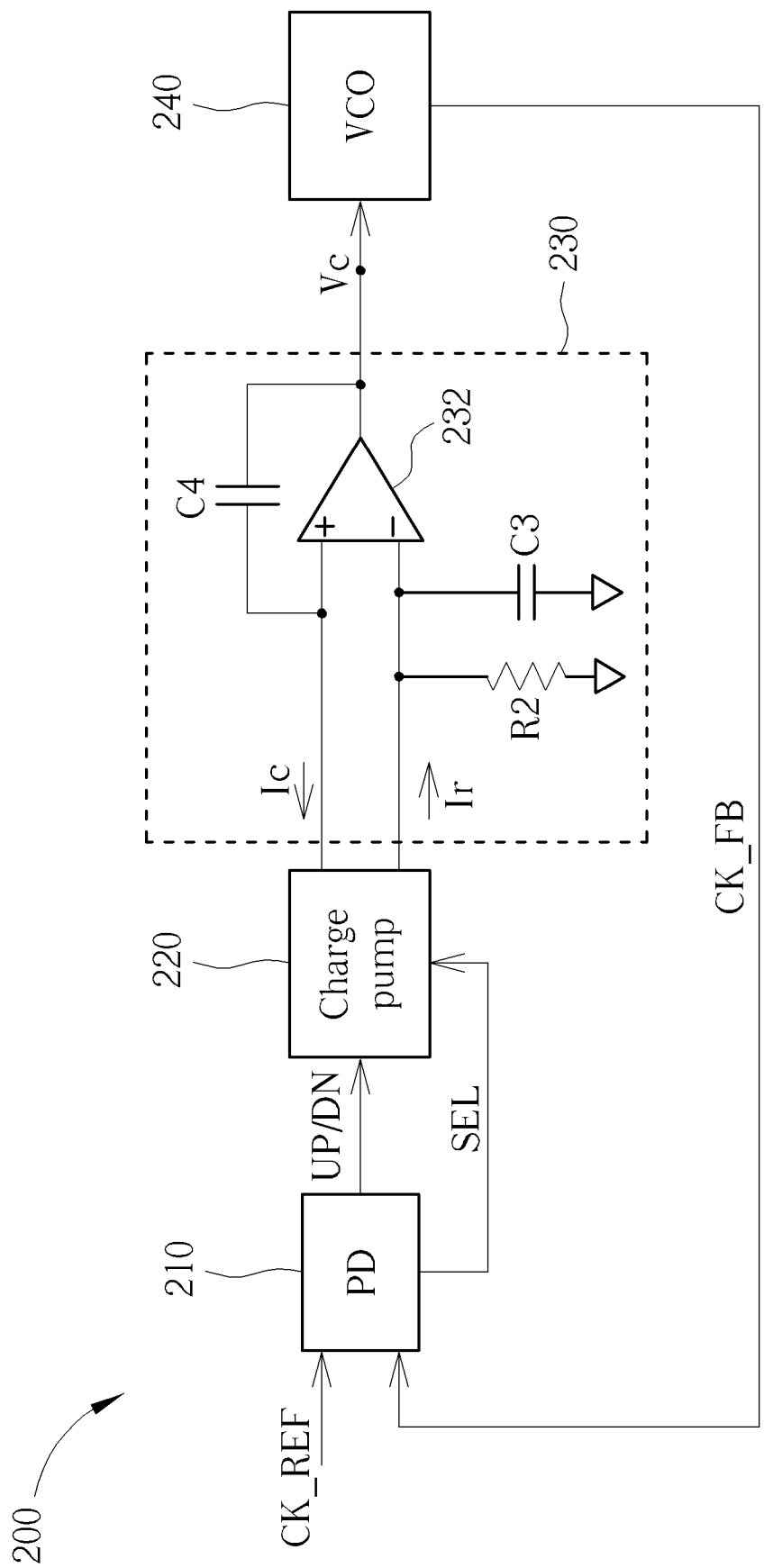
FIG. 2 is a diagram illustrating a CDR according to one embodiment of the present invention.

Please refer to FIG. 2, which is a diagram illustrating a clock and data recovery (CDR) 200 according to one embodiment of the present invention. As shown in FIG. 2, the CDR 200 comprises a phase detector 210, a charge pump 220, an active filter 220 and a voltage-controlled oscillator 240, where the active filter 220 comprises an operational amplifier 232, a resistor R2 and two capacitors C3 and C4. In this embodiment, only one charge pump 220 is positioned in the CDR 200 to provide two currents Ic and Ir to the active filter 230. In the operations of the CDR 200, the phase detector 210 compares a reference clock CK_REF and a feedback clock CK_FB to generate an up signal UP and a down signal DN, and in an optional design, the phase detector 210 further generates a selection signal to the charge pump 220. The charge pump 220 receives the up signal UP, the down signal DN and the selection signal, if any, to generate two currents Ic and Ir. The active filter 230 generates a control signal Vc according to the currents Ic and Ir. The voltage-controlled oscillator 240 generates a feedback clock CK_FB according to the control signal Vc.

The following embodiments focus on the designs of the charge pump 120/220, and the detailed circuit structures and operations of the other elements are omitted here.

Figure 3:
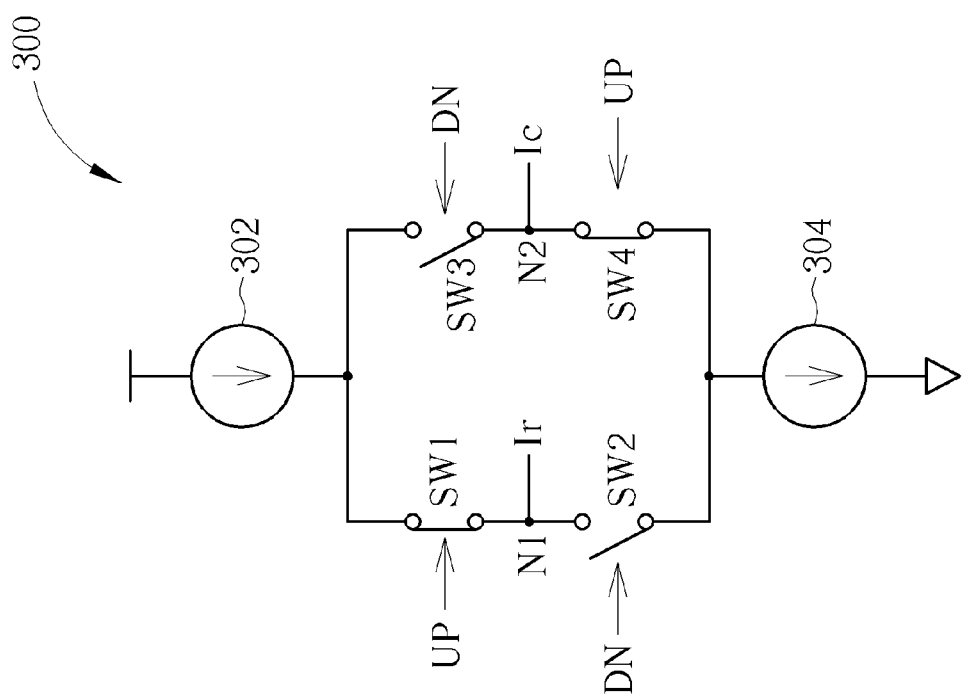
FIG. 3 is a diagram illustrating a charge pump according to one embodiment of the present invention.

Please refer to FIG. 3, which is a diagram illustrating a charge pump 300 according to one embodiment of the present invention. As shown in FIG. 3, the charge pump 300 comprises a current source circuit 302, a current sink circuit 304 and a switch circuit, where the switch circuit comprises four switches SW1-SW4. In this embodiment, the switch SW1 is coupled between the current source circuit 302 and an output terminal N1, and the switch SW1 selectively connects the current source circuit 302 to the output terminal N1 according to the up signal UP; the switch SW2 is coupled between the current sink circuit 304 and the output terminal N1, and the switch SW2 selectively connects the current sink circuit 304 to the output terminal N1 according to the down signal DN; the switch SW3 is coupled between the current source circuit 302 and an output terminal N2, and the switch SW3 selectively connects the current source circuit 302 to the output terminal N2 according to the down signal DN; and the switch SW4 is coupled between the current sink circuit 304 and the output terminal N2, and the switch SW4 selectively connects the current sink circuit 304 to the output terminal N2 according to the up signal UP. In this embodiment, when the up signal UP is equal to "1", the switches SW1 and SW4 are turned on, and a current generated from the current source circuit 302 flows through the switch SW1 and output terminal N1 to serve as the current Ir, and the current Ic flows to the current sink circuit 304 via the output terminal N2 and the switch SW4; and when the down signal DN is equal to "1", the switches SW2 and SW3 are turned on, and the current generated from the current source circuit 302 flows through the switch SW3 and output terminal N2 to serve as the current Ic, and the current Ir flows to the current sink circuit 304 via the output terminal N1 and the switch SW2.

Figure 4:
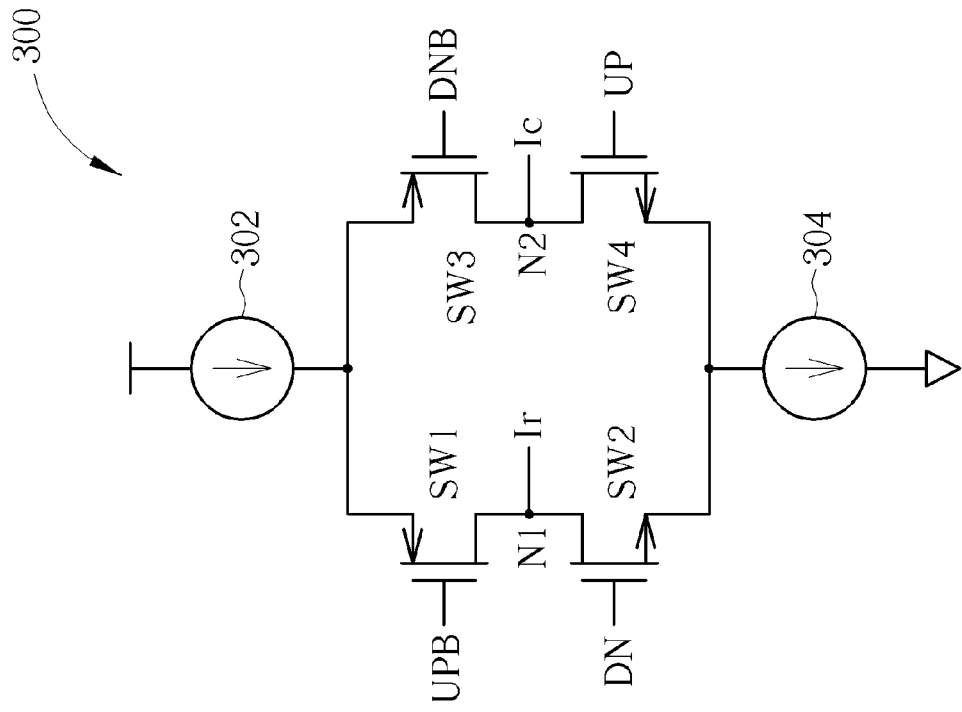
FIG. 4 shows the circuit structure of the charge pump shown in FIG. 3 according to one embodiment of the present invention.

FIG. 4 shows the circuit structure of the charge pump 300 shown in FIG. 3 according to one embodiment of the present invention. As shown in FIG. 4, the switches SW1 and SW3 are implemented by PMOSs, the switches SW2 and SW4 are implemented by NMOSs, and the symbol "UPB" is an inverted signal of the up signal UP, and the symbol "DNB" is an inverted signal of the down signal DN.

In the embodiment shown in FIG. 3, only one current source 302 and only one current circuit 304 are designed in the charge pump 300 to provide two currents Ic and Ir to the following active filter 130/230. Therefore, comparing with the prior art PLL/CDR having two charge pumps, the embodiment can lower the chip area.

Figure 5:
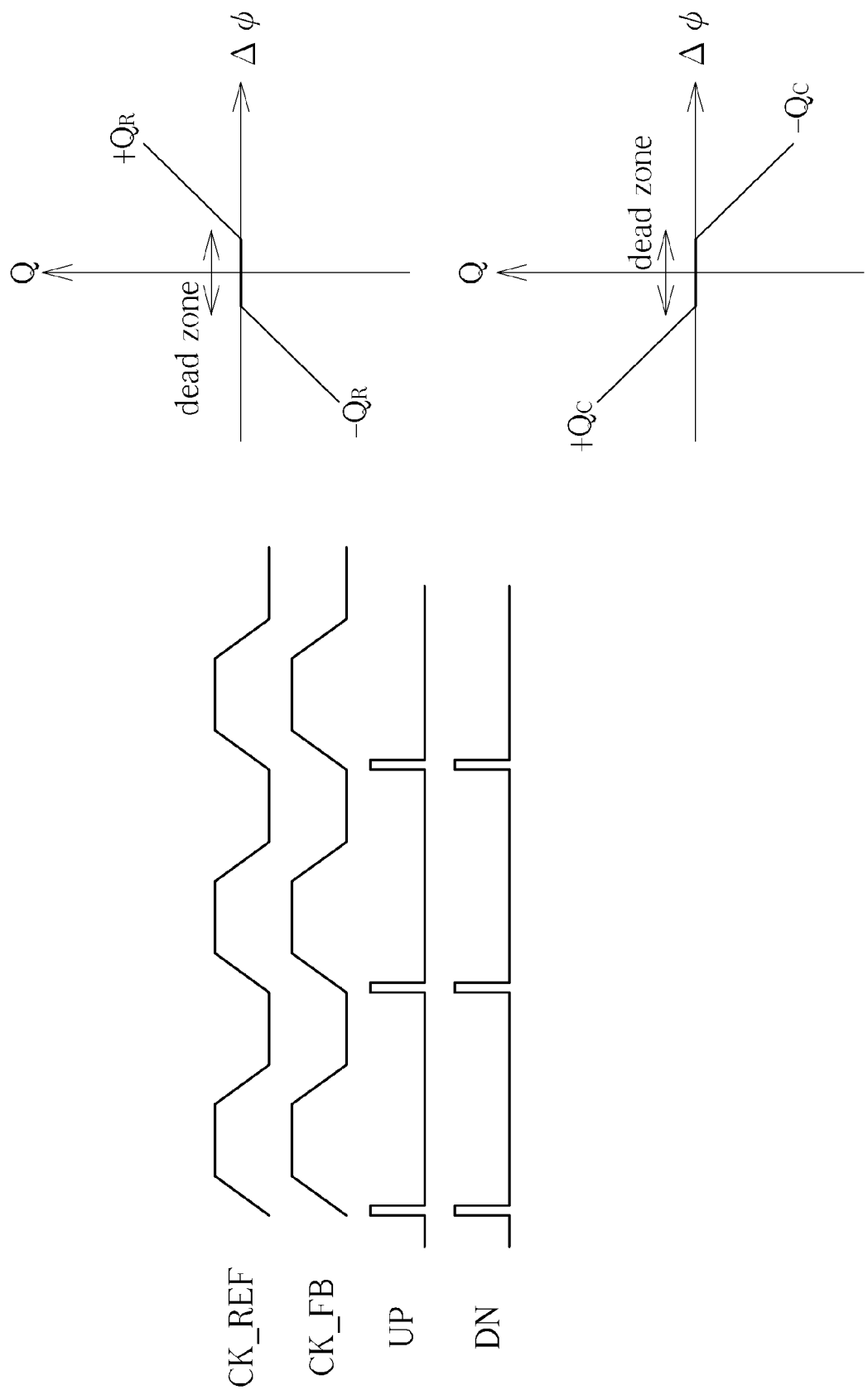
FIG. 5 is a diagram showing a dead zone of the charge pump.

The charge pump 300 shown in FIG. 3 can be used in the CDR 200 or the PLL 100. However, when the charge pump 300 is applied to the PLL 100, the switches SW1-SW4 may not turn on fully because the phases of the reference clock CK_REF and the feedback clock CK_FB are too close, and therefore a dead zone is caused. Please refer to FIG. 5, which is a diagram showing a dead zone of the charge pump. When a phase difference $\Delta\phi$ of the reference clock CK_REF and the feedback clock CK_FB is small, that is phase difference $\Delta\phi$ is in the dead zone, pulse widths of the up signal UP and the down signal DN are very short, e.g. 10 ps. Therefore, the switches SW1-SW4 may not turn on fully due to the short pulse widths, and the charge pump 300 may not generate sufficient charges Q to provide the currents Ir and Ic.

Figure 6:
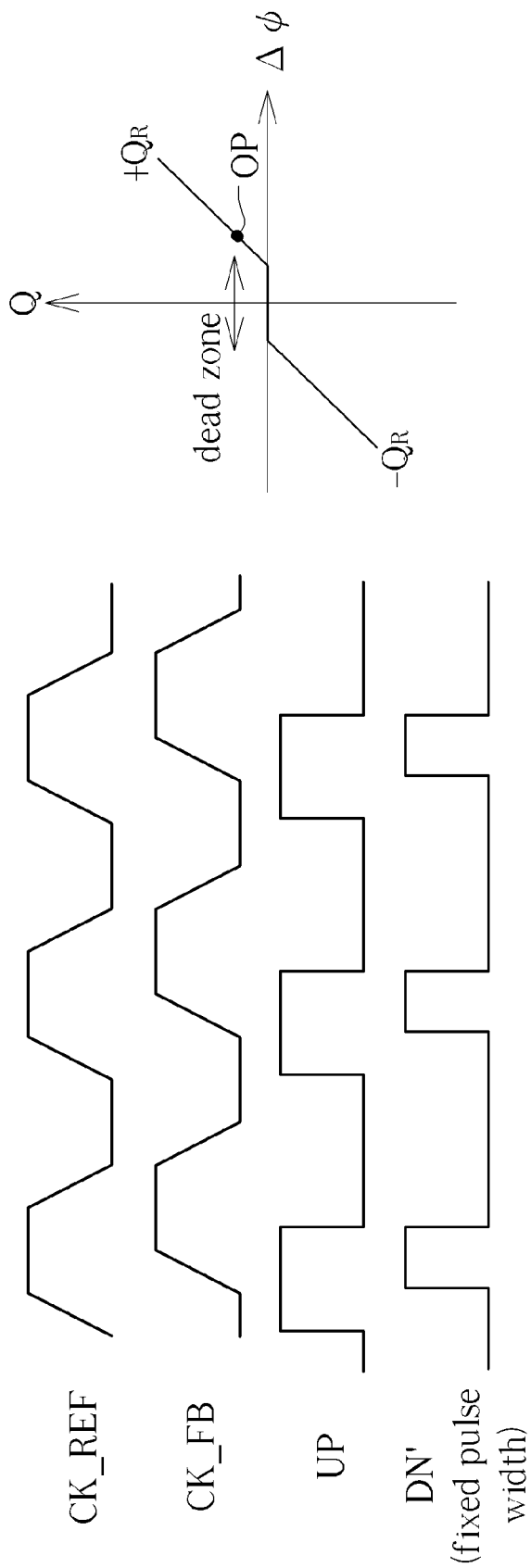
FIG. 6 shows a diagram illustrating the operation of the charge pump when the down signal DN is replaced by a new down signal DN' with the fixed pulse width and the reference clock CK_REF leads the feedback clock CK_FB.

To solve this problem, one of the up signal UP and the down signal DN may be replaced by a signal having a fixed pulse width, e.g. 100 ps, to provide a bleed current to make the phase difference $\Delta\phi$ not in the dead zone. In detail, please refer to FIG. 6, which shows a diagram illustrating the operation of the charge pump 300 when the down signal DN is replaced by a new down signal DN' with the fixed pulse width and the reference clock CK_REF leads the feedback clock CK_FB. As shown in FIG. 6, since the new down signal DN' has a fixed pulse width such as 100 ps, the pulse width of the up signal UP will not be too short to fully turn on the corresponding switches SW1 and SW4 even if the phase difference $\Delta\phi$ of the reference clock CK_REF and the feedback clock CK_FB is very small, that is the operating point OP will be forced not in the dead zone. In addition, please refer to FIG. 7, which shows a diagram illustrating the operation of the charge pump 300 when the down signal DN is replaced by a new down signal DN' with the fixed pulse width and the reference clock CK_REF lags the feedback clock CK_FB. Similar to the embodiment shown in FIG. 6, because the new down signal DN' has a fixed pulse width such as 100 ps, the pulse width of the up signal UP will not be too short to fully turn on the corresponding switches SW1 and SW4 even if the phase difference $\Delta\phi$ of the reference clock CK_REF and the feedback clock CK_FB is very small, that is the operating point OP will be forced not in the dead zone.

In this embodiment, the new down signal DN' can be obtained from any other appropriate circuits, and the down signal DN generated from phase frequency detector 112 is not used in the charge pump.

Figure 7:
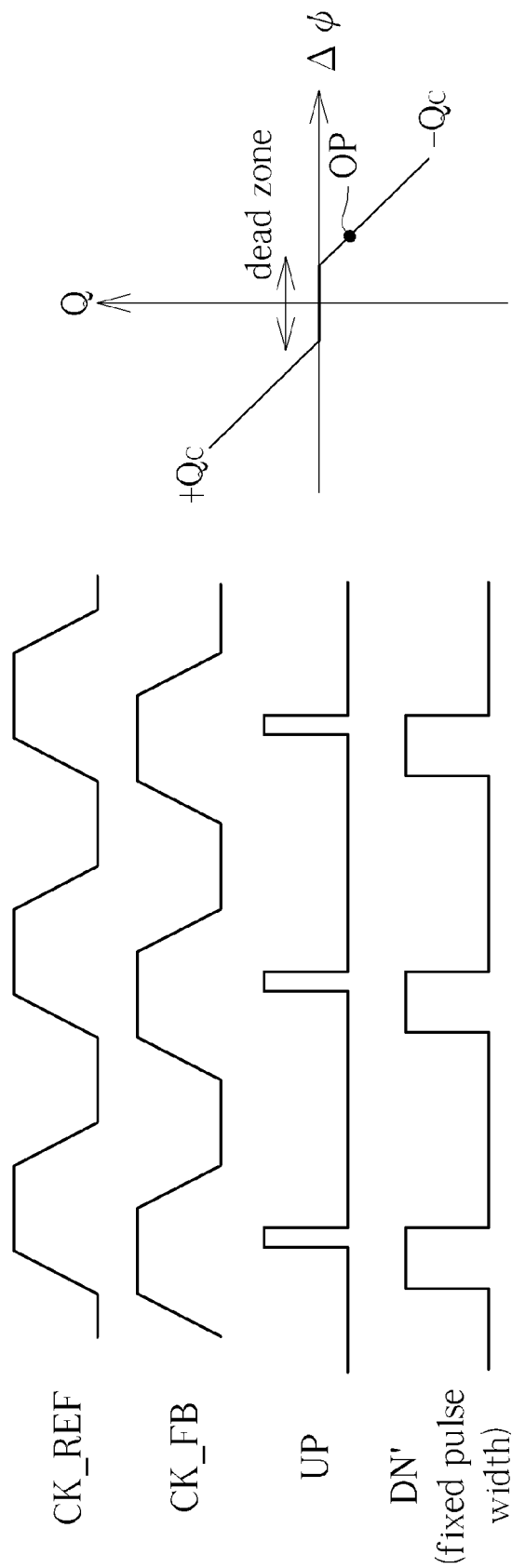
FIG. 7 shows a diagram illustrating the operation of the charge pump when the down signal DN is replaced by a new down signal DN' with the fixed pulse width and the reference clock CK_REF lags the feedback clock CK_FB.

The embodiments shown in FIG. 6 and FIG. 7 replace the down signal DN by the signal having a fixed pulse width, but it's not a limitation of the present invention. In other embodiments, the up signal UP can be replaced by a new up signal having a fixed pulse width such as 100 ps, while the down signal DN is not changed. This alternative design shall fall within the scope of the present invention.

Figure 8:
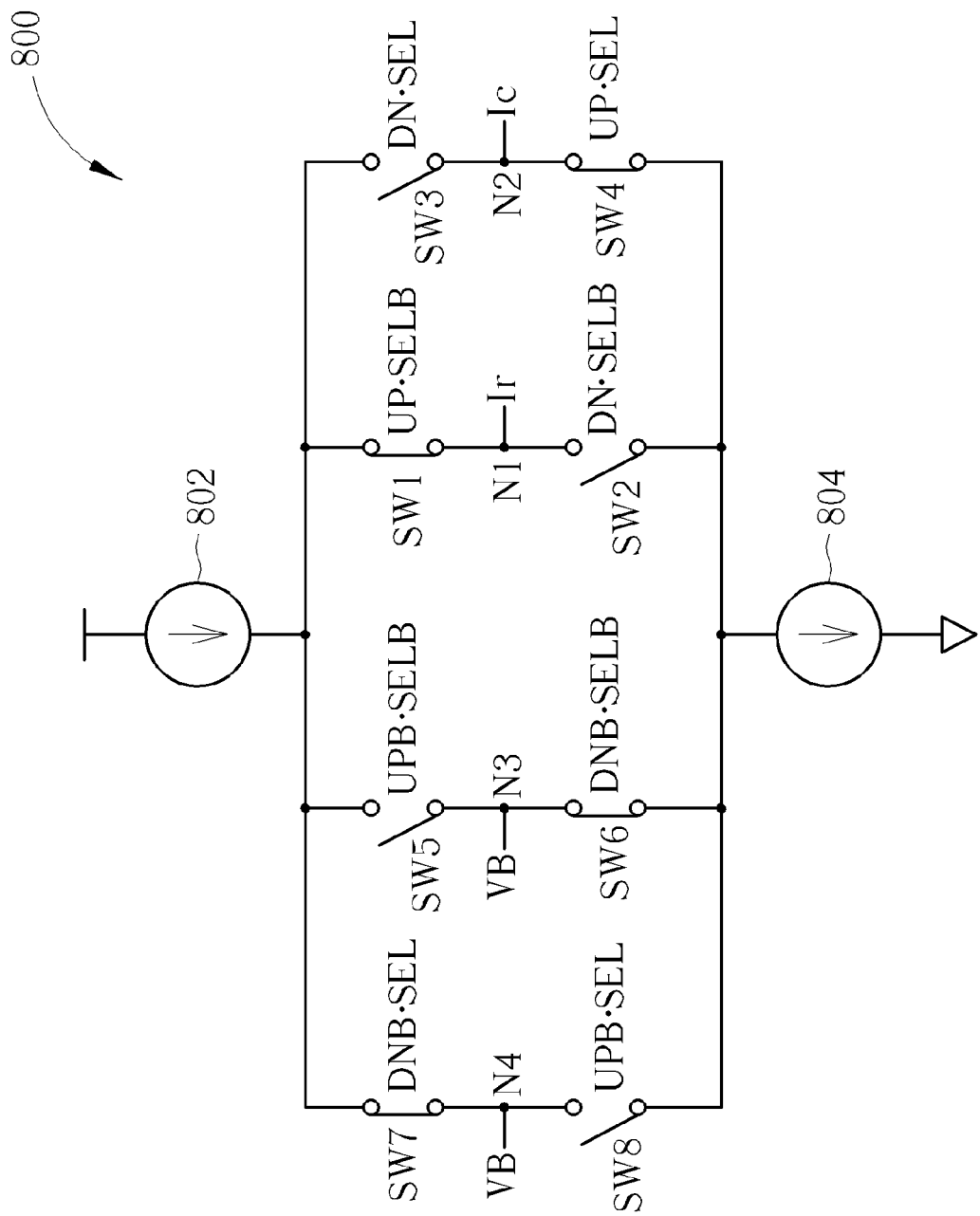
FIG. 8 is a diagram illustrating a charge pump according to another embodiment of the present invention

Please refer to FIG. 8, which is a diagram illustrating a charge pump 800 according to another embodiment of the present invention. As shown in FIG. 8, the charge pump 800 comprises a current source circuit 802, a current sink circuit 804 and a switch circuit, where the switch circuit comprises eight switches SW1-SW8. In this embodiment, the switch SW1 is coupled between the current source circuit 802 and an output terminal N1, and the switch SW1 is selectively connecting the current source circuit 802 to the output terminal N1 according to the up signal UP and the selection signal SEL; the switch SW2 is coupled between the current sink circuit 804 and the output terminal N1, and the switch SW2 is selectively connecting the current sink circuit 804 to the output terminal N1 according to the down signal DN and the selection signal SEL; the switch SW3 is coupled between the current source circuit 802 and an output terminal N2, and the switch SW3 is selectively connecting the current source circuit 802 to the output terminal N2 according to the down signal DN and the selection signal SEL; the switch SW4 is coupled between the current sink 804 and the output terminal N2, and the switch SW4 is selectively connecting the current sink circuit 804 to the output terminal N2 according to the up signal UP and the selection signal SEL; the switch SW5 is coupled between the current source circuit 802 and an output terminal N3, and the switch SW5 is selectively connecting the current source circuit 802 to the output terminal N3 according to the up signal UP and the selection signal SEL; the switch SW6 is coupled between the current sink circuit 804 and the output terminal N3, and the switch SW6 is selectively connecting the current sink circuit 804 to the output terminal N3 according to the down signal DN and the selection signal SEL; the switch SW7 is coupled between the current source circuit 802 and an output terminal N4, and the switch SW7 is selectively connecting the current source circuit 802 to the output terminal N4 according to the down signal DN and the selection signal SEL; the switch SW8 is coupled between the current sink circuit 804 and the output terminal N4, and the switch SW8 is selectively connecting the current sink circuit 804 to the output terminal N4 according to the up signal UP and the selection signal SEL. In FIG. 8, the output terminals N3 and N4 are supplied by a bias voltage VB, the symbol "UPB" is an inverted signal of the up signal UP, the symbol "DNB" is an inverted signal of the down signal DN, the symbol "SELB" is an inverted signal of the selection signal SEL, and the symbol "." is an "AND" operator.

In the embodiment shown in FIG. 8, a time-division mechanism is applied to make the charge pump 800 to generate the currents Ir and Ic alternately. In this embodiment, when the up signal UP is equal to "1" and the selection signal SEL is equal to "0", the switch SW1 is turned on, and a current generated from the current source circuit 802 flows through the switch SW1 and output terminal N1 to serve as the current Ir; when the up signal UP is equal to "1" and the selection signal SEL is equal to "1", the switch SW4 is turned on, and the current Ic flows to the current sink circuit 804 via the output terminal N2 and the switch SW4; when the down signal DN is equal to "1" and the selection signal SEL is equal to "0", the switch SW2 is turned on, and the current Ir flows to the current sink circuit 804 via the output terminal N1 and the switch SW2; and when the down signal UP is equal to "1" and the selection signal SEL is equal to "1", the switch SW3 is turned on, and a current generated from the current source circuit 802 flows through the switch SW1 and output terminal N1 to serve as the current Ic.

Figure 9:
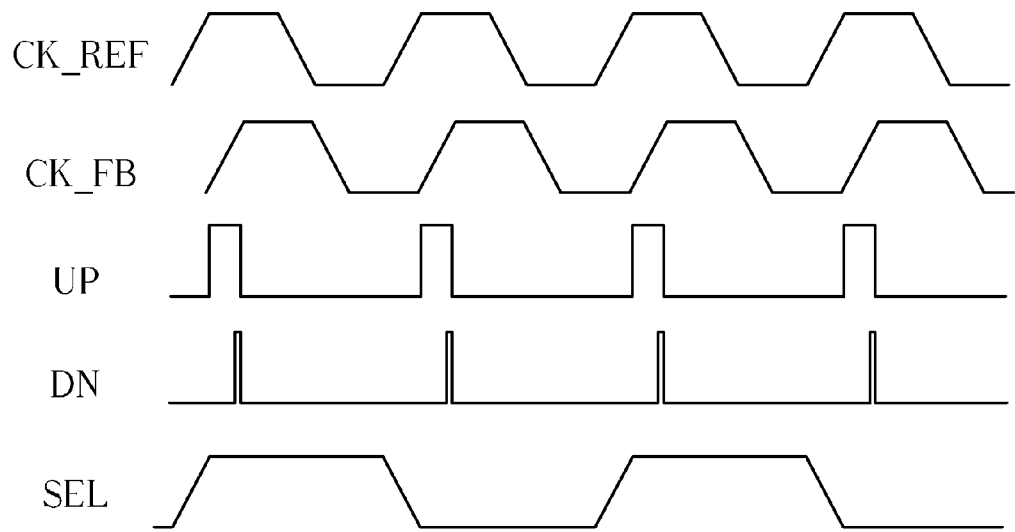
FIG. 9 is a timing diagram of the signals of the charge pump when the duty cycle of the selection signal is 1:1 according to one embodiment of the present invention.

In addition, to achieve the capacitance multiplier effect of the active filter 130/230, the charge current and discharge current (i.e. Ir and Ic) of the charge pump 800 are desired to be different. Therefore, in one embodiment, the current source circuit 802 and the current sink circuit 804 are variable current source/sink, and the currents are adjusted dynamically; and in another embodiment, the duty cycle of the selection signal SEL is controlled to be 1:N or N:1 (N is greater than one), to make the currents Ir and Ic to have different values. In detail, please refer to FIG. 9, which is a timing diagram of the signals of the charge pump 800 when the duty cycle of the selection signal is 1:1 according to one embodiment of the present invention. In FIG. 9, the selection signal SEL is generated by frequency dividing the reference clock CK_REF or the feedback clock CK_FB with a factor 2, and the selection signal SEL has a duty cycle 1:1. In this embodiment, if it is desired that Ir=3*Ic, the current provided by the current source circuit 802 and the current sink circuit 804 when the selection signal SEL is equal to "0" is three times the current provided by the current source circuit 802 and the current sink circuit 804 when the selection signal SEL is equal to "1". By adjusting the current source circuit 802 and the current sink circuit 804 alternately according to a voltage level (i.e. "0" or "1") of the selection signal SEL, the charge pump 800 can provide different charge current and discharge current to the following active filter 130/230.

Figure 10:
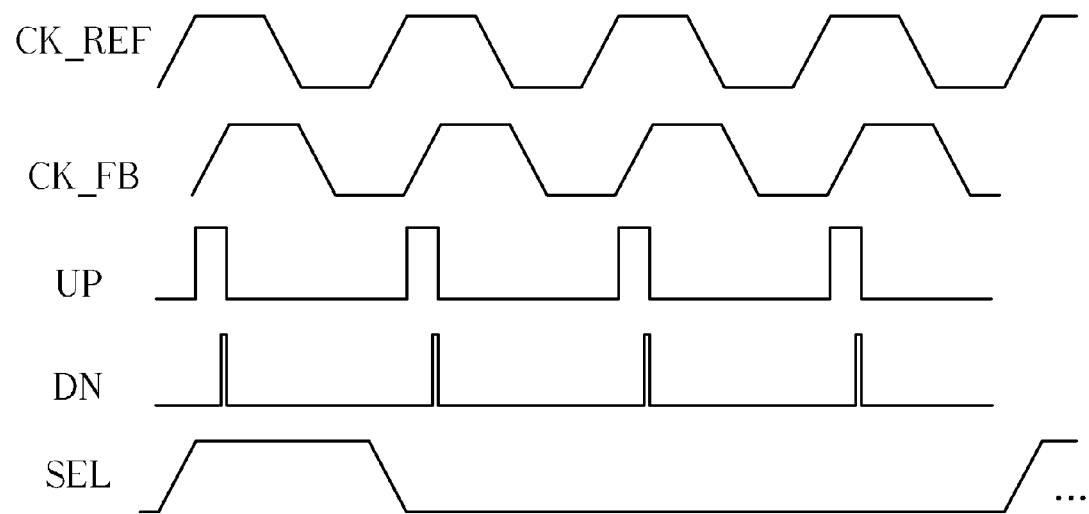
FIG. 10 is a timing diagram of the signals of the charge pump when the duty cycle of the selection signal is 1:N or N:1 according to one embodiment of the present invention.

Please refer to FIG. 10, which is a timing diagram of the signals of the charge pump 800 when the duty cycle of the selection signal is 1:N or N:1 according to one embodiment of the present invention. In FIG. 10, the selection signal SEL is generated by frequency dividing the reference clock CK_REF or the feedback clock CK_FB, and the duty cycle is adjusted to be 1:N or N:1. In this embodiment, if it is desired that Ir=3*Ic, the duty cycle of the selection signal SEL is designed to be 1:3. By controlling the ratio of the charging period and the discharging period, the charge pump 800 can provide different charge current and discharge current to the following active filter 130/230.

Figure 11:
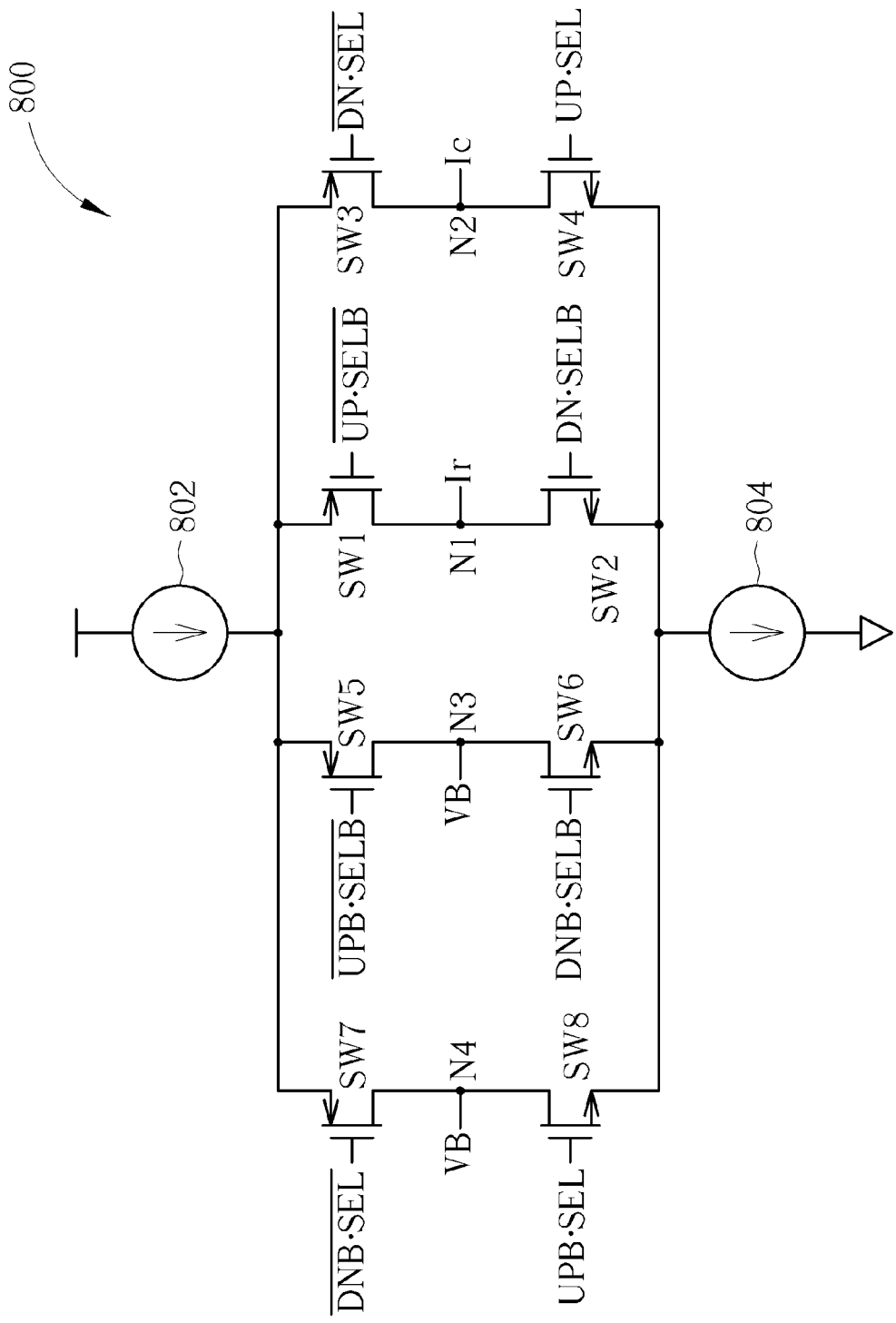
FIG. 11 shows the circuit structure of the charge pump shown in FIG. 8 according to one embodiment of the present invention.

FIG. 11 shows the circuit structure of the charge pump 800 shown in FIG. 8 according to one embodiment of the present invention. As shown in FIG. 8, the switches SW1, SW3, SW5 and SW7 are implemented by PMOSs, the switches SW2, SW4, SW6 and SW8 are implemented by NMOSs.

In the embodiment shown in FIGS. 8 and 11, because of the switches SW5-SW8 and the bias voltage VB, the charge pump 800 may not suffer the dead zone problem, so the charge pump 800 can be applied to each of the PLL 100 and the CDR 200.

Briefly summarized, the present invention provides a charge pump sharing circuit to generate two currents Ir and Ic by using only one current source and only one current sink, and charge pump of the embodiments can be used in the PLL or CDR having the active filter. Because only one charge pump is required in the PLL or CDR, the chip area can be indeed reduced to lower the manufacturing costs.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A charge pump, comprising:
   a current source circuit;
   a current sink circuit; and
   a switch circuit coupled between the current source circuit and the current sink circuit, for generating a first current at a first output terminal of the charge pump and generating a second current at a second output terminal of the charge pump according to a first control signal and a second control signal, wherein each of the first current and the second current is generated by the current source circuit, and both the first current and the second current serve as output currents of the charge pump.

2. The charge pump of claim 1, wherein the switch circuit comprises:
   a first switch, coupled between the current source circuit and the first output terminal, for selectively connecting the current source circuit to the first output terminal according to the first control signal;
   a second switch, coupled between the current sink circuit and the first output terminal, for selectively connecting the current sink circuit to the first output terminal according to the second control signal;
   a third switch, coupled between the current source circuit and the second output terminal, for selectively connecting the current source circuit to the second output terminal according to the second control signal; and
   a fourth switch, coupled between the current sink circuit and the second output terminal, for selectively connecting the current sink circuit to the second output terminal according to the first control signal.

3. The charge pump of claim 2, wherein when the first control signal turns on the first switch and the fourth switch and the second control signal turns off the second switch and the third switch, the charge pump outputs the first current at the first output terminal and receives the second current from the output terminal; and when the first control signal turns off the first switch and the fourth switch and the second control signal turns on the second switch and the third switch, the charge pump receives the first current from the first output terminal and outputs the second current at the output terminal.

4. The charge pump of claim 2, wherein the charge pump is applied to a clock and data recovery (CDR), and the first control signal and the second control signal are generated from a phase detector within the CDR.

5. The charge pump of claim 2, wherein one of the first control signal and the second control signal has a fixed pulse width.

6. The charge pump of claim 5, wherein the charge pump is applied to a CDR or a phase-locked loop (PLL), and the first control signal and the second control signal are generated by a phase detector within the CDR or generated by a phase frequency detector within the PLL.

7. The charge pump of claim 2, wherein the first switch selectively connects the current source circuit to the first output terminal according to the first control signal and a selection signal, and the third switch selectively connects the current source circuit to the second output terminal according to the second control signal and the selection signal.

8. The charge pump of claim 7, wherein the first switch and the third switch are not turned on simultaneously.

9. The charge pump of claim 7, wherein the current source circuit is a variable current source, and the current source circuit provides different currents to the first output terminal and the third output terminal, respectively.

10. The charge pump of claim 7, wherein the first switch selectively connects the current source circuit to the first output terminal according to the first control signal and an inverted signal of the selection signal, and the third switch selectively connects the current source circuit to the second output terminal according to the second control signal and the selection signal.

11. The charge pump of claim 7, wherein the first switch selectively connects the current source circuit to the first output terminal according to the first control signal only when the selection signal is at a first logic level, and the third switch selectively connects the current source circuit to the second output terminal according to the second control signal only when the selection signal is at a second logic level different from the first logic level.

12. The charge pump of claim 11, wherein a duty cycle of the selection signal is 1:N or N:1, and N is an integer greater than one.

13. The charge pump of claim 7, wherein the charge pump is applied to a CDR or a PLL, and the selection signal is generated by frequency dividing a reference clock or a feedback clock within the CDR or the PLL.

14. The charge pump of claim 2, wherein the switch circuit further comprises:
   a fifth switch, coupled between the current source circuit and a third output terminal;
   a sixth switch, coupled between the current sink circuit and the third output terminal;
   a seventh switch, coupled between the current source circuit and a fourth output terminal; and
   an eighth switch, coupled between the current sink circuit and the fourth output terminal;
   wherein the third output terminal and the fourth output terminal are coupled to a bias voltage.

15. The charge pump of claim 14, wherein the first switch selectively connects the current source circuit to the first output terminal according to the first control signal and a selection signal, the third switch selectively connects the current source circuit to the second output terminal according to the second control signal and the selection signal, the fifth selectively connects the current source circuit to the third output terminal according to the first control signal and the selection signal, and the seventh switch selectively connects the current source circuit to the fourth output terminal according to the second control signal and the selection signal.

16. A phase-locked loop, comprising:
   a phase frequency detector, for comparing a reference clock with a feedback clock to generate a first control signal and a second control signal;
   a charge pump, comprising:
      a current source circuit;
      a current sink circuit; and
      a switch circuit, coupled between the current source circuit and the current sink circuit, for generating a first current at a first output terminal of the charge pump and generating a second current at a second output terminal of the charge pump according to at least one of the first control signal and the second control signal, wherein each of the first current and the second current is generated by the current source circuit; and an active filter, for receiving the first current and the second current from the charge pump to generate a control signal;

a voltage-controlled oscillator, coupled to the active filter, for generating an oscillation signal according to the control signal; and a frequency divider, coupled to the voltage-controlled oscillator, for frequency dividing the oscillation signal to generate the feedback signal.

17. The phase-locked loop of claim 16, wherein the charge pump generates the first current at the first output terminal and generating the second current at the second output terminal according to a signal with a fixed pulse width and one of the first control signal and the second control signal.

18. The phase-locked loop of claim 16, wherein the first switch selectively connects the current source circuit to the first output terminal according to the first control signal and a selection signal, and the third switch selectively connects the current source circuit to the second output terminal according to the second control signal and the selection signal, and the first switch and the third switch are not turned on simultaneously.

19. A clock and data recovery, comprising:
   a phase detector, for comparing a reference clock with a feedback clock to generate a first control signal and a second control signal;
   a charge pump, comprising:
      a current source circuit;
      a current sink circuit; and
      a switch circuit, coupled between the current source circuit and the current sink circuit, for generating a first current at a first output terminal of the charge pump and generating a second current at a second output terminal of the charge pump according to at least one of the first control signal and the second control signal, wherein each of the first current and the second current is generated from the current source circuit; and
   an active filter, for receiving the first current and the second current from the charge pump to generate a control signal; and
   a voltage-controlled oscillator, coupled to the active filter, for generating the feedback clock according to the control signal.

20. The clock and data recovery of claim 19, wherein the switch circuit comprises:
   a first switch, coupled between the current source and the first output terminal, for selectively connecting the current source circuit to the first output terminal according to the first control signal;
   a second switch, coupled between the current sink circuit and the first output terminal, for selectively connecting the current sink circuit to the first output terminal according to the second control signal;
   a third switch, coupled between the current source circuit and the second output terminal, for selectively connecting the current source circuit to the second output terminal according to the second control signal; and
   a fourth switch, coupled between the current sink circuit and the second output terminal, for selectively connecting the current sink circuit to the second output terminal according to the first control signal.

* * * * *